United States Patent [19]

Hwang et al.

[11] Patent Number: 4,894,657

[45] Date of Patent: Jan. 16, 1990

[54] PIPELINED ANALOG-TO-DIGITAL ARCHITECTURE WITH PARALLEL-AUTOZERO ANALOG SIGNAL PROCESSING

[75] Inventors: Jyh-Ping Hwang, Schenectady; Miran Milkovic, Scotia, both of N.Y.

[73] Assignee: General Electric Company, Schenectady, N.Y.

[21] Appl. No.: 275,821

[22] Filed: Nov. 25, 1988

[51] Int. Cl.$^4$ ............................................. H03M 1/44
[52] U.S. Cl. .................................... 341/158; 341/122; 341/155
[58] Field of Search ........................ 341/122, 158, 155

[56] References Cited

U.S. PATENT DOCUMENTS

| | | | |
|---|---|---|---|
| 4,611,196 | 9/1986 | Fernandez | 341/158 |
| 4,695,825 | 9/1987 | Bloy et al. | 341/122 |
| 4,745,394 | 5/1988 | Cornett | 341/158 |
| 4,774,499 | 9/1988 | Mapleston | 341/158 |

OTHER PUBLICATIONS

Dingwall et al., "An 8-MHz CMOS Subranging 8-Bit A/D Converter", *IEEE J. of Solid-State Circuits*, Dec. 1985, pp. 1138-1143.

Lewis et al., "A Pipelined 5-Msample/s 9-Bit Analog-to-Digital Converter", *IEEE J. of Solid-State Circuits*, Dec. 1987, pp. 954-961.

Takemoto et al., "A Fully Parallel 10-Bit A/D Converter with Video Speed", *IEEE J. of Solid-State Circuits*, Dec. 1982, pp. 1133-1138.

Primary Examiner—William M. Shoop, Jr.
Assistant Examiner—Helen Kim
Attorney, Agent, or Firm—Marvin Snyder; James C. Davis, Jr.

[57] ABSTRACT

A pipelined analog-to-digital converter architecture comprises three pipeline stages wherein the first stage includes a low-resolution flash A/D subconverter (10), two sample-and-hold amplifiers (12 and 14), two D/A converters (16 and 18), and two unity-gain buffers (20 and 22). Parallel-autozero analog processing is accomplished by alternately passing the analog signal through one or the other of two parallel processing channels. The sampled analog signal is delivered to the flash A/D subconverter and the D/A converters simultaneously. The residue from the D/A converters is delivered to the second stage, passing through a flash A/D subconverter (24), an additional D/A converter (26), and alternately through two comparators (28 and 30) each having a gain of eight. The second stage produces and delivers its residual voltage to the final pipeline stage comprising a flash A/D subconverter (32). The unity-gain buffers require a minimal gain-bandwidth product for a given sampling rate and allow the architecture to operate at high speed, while the first stage D/A converters provide good accuracy.

8 Claims, 3 Drawing Sheets

PIPELINED ANALOG-TO-DIGITAL ARCHITECTURE WITH PARALLEL-AUTOZERO ANALOG SIGNAL PROCESSING

BACKGROUND OF THE INVENTION

The present invention generally relates to analog-to-digital (A/D) converters and, more particularly, to a pipelined monolithic A/D architecture which overcomes the performance limitations of previous pipelined architectures through the use of a new parallel-autozero analog signal processing scheme requiring a smaller gain-bandwidth product and being able to achieve a higher resolution at a higher speed with less accurate matching of components. The architecture of the invention can be applied to the realization of high-resolution (greater than twelve bits), high-speed (greater than twenty megaHertz (MHz)), small area (less than 10,000 square mils), and low-power (less than 0.2 watt) A/D converters.

DESCRIPTION OF THE PRIOR ART

Much advanced electronic circuitry such as employed in radar, satellite communications, instrumentation and high-quality video requires availability of high accuracy, excellent linearity, and high sampling rate A/D converters. To date, it has not been feasible to implement monolithic A/D converters with more than 12-bit resolution and more than 10-MHz sampling rate with low power and small chip area.

Previous very large scale integrated (VLSI) circuit implementations of high-speed and high-resolution A/D converters have used parallel (i.e., flash) or multistage (i.e., two-step subranging or pipelined) architectures. Examples of these types of converters are described, for example, in "A Fully Parallel 10-Bit A/D Converter with Video Speed" by Toyoki Takemoto, Michihiro Inoue, Hideaki Sadamatsu, Akira Matsuzawa, and Kazuhiko Tsuji, *IEEE Journal of Solid-State Circuits*, vol. SC-17, no. 6, pp. 1133 to 1138 (Dec. 1982), "An 8-MHz CMOS Subranging 8-Bit A/D Converter" by Andrew G. F. Dingwall and Victor Zazzu, *IEEE Journal of Solid-State Circuits*, vol. SC-20, no. 6, pp. 1138 to 1143 (Dec. 1985), and "A Pipelined 5-Msample/s 9-bit Analog-to-Digital Converter" by Stephen H. Lewis and Paul R. Gray, *IEEE Journal of Solid-State Circuits*, vol. SC-22, no. 6, pp. 954 to 961 (Dec. 1987). The parallel architectures require a large number of comparators, making their use for higher resolution (more than ten bits) impractical. The multistage conversion architectures reduce the total number of comparators significantly, resulting in a smaller chip area and lower power dissipation. A conventional pipelined A/D converter employs a plurality of stages wherein each stage initially samples and holds the output signal of the preceding stage and then performs a low resolution A/D conversion on the held signal. The digital code thus produced is converted back to an analog signal by a digital-to-analog (D/A) converter and subtracted from the held signal to produce a residue that is amplified and passed to the next stage. This architecture offers the advantages of high throughput rate and low hardware cost, with the greatest hindrance to performance speed and accuracy being the analog processing circuitry. For instance, the required high gain-bandwidth products of the interstage amplifiers tend to limit the speed of the known pipelined converters. Moreover, linearity errors in the resistive D/A converter tend to limit accuracy of the converter. These limitations have held the known pipelined architectures to about nine or ten bit resolution and at about five to fifteen MHz sampling rates.

SUMMARY OF THE INVENTION

It is therefore an object of the present invention to provide a new architecture for the implementation of high-speed, high-resolution and small silicon area A/D converters operating at low power.

It is a further object of this invention to provide an integrated circuit architecture which overcome the performance limitations of prior art pipelined A/D integrated circuit architectures.

Briefly, in accordance with a preferred embodiment of the invention, an A/D converter architecture includes a plurality of pipeline stages, preferably three. The first stage comprises a low-resolution flash A/D converter (i.e. subconverter), two sample-and-hold (S/H) amplifiers, two capacitive D/A converters, and two unity-gain buffers. Parallel-autozero analog processing in the first stage is accomplished by alternately processing the analog signal through two parallel processing channels. The sampled analog signal is delivered by the S/H amplifiers to the flash A/D subconverter and both capacitive D/A converters simultaneously. The residue from the D/A converters is delivered to the second stage which comprises a flash A/D subconverter, a resistive D/A converter, and two amplifiers having a gain of eight. The second stage produces and delivers its residual voltage to the last pipeline stage comprising a flash A/D subconverter.

BRIEF DESCRIPTION OF THE DRAWINGS

The foregoing and other objects, aspects and advantages of the invention will be better understood from the following detailed description of a preferred embodiment of the invention with reference to the accompanying drawings, in which:

FIGS. 2A, 2B and 2C are part schematic and part block diagrams illustrating the principles of autozeroing as used in the present invention;

DETAILED DESCRIPTION OF A PREFERRED EMBODIMENT OF THE INVENTION

Figure 1:
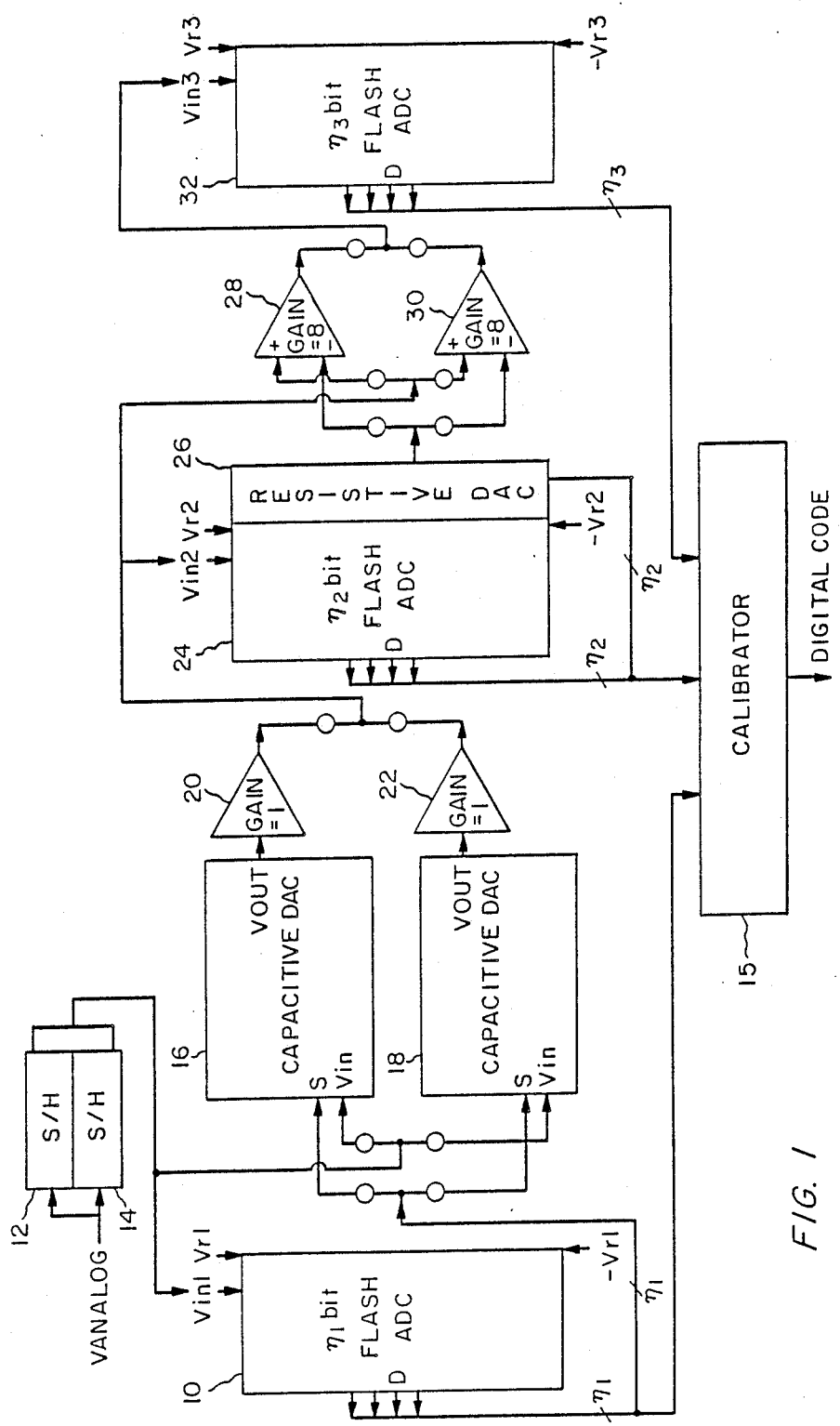
FIG. 1 is a block diagram showing the architecture of a three-stage pipelined A/D converter according to the principles of the invention.

FIG. 1 shows the architecture of the pipelined A/D converter as being composed of a pipeline of three subconverter stages. It will be appreciated, however, that the invention is not limited to any particular number of stages in the pipeline. The first stage of the pipeline is made up of a low-resolution ($n_1$ bits) flash A/D converter (i.e., an A/D subconverter within the pipelined A/D converter) 10, two sample-and-hold (S/H) amplifiers 12 and 14, and two capacitive D/A converters 16 and 18 coupled, respectively, to two unity-gain buffers 20 and 22 to make up two parallel processing channels. The parallel-autozero analog processing is accomplished by alternately processing an analog signal through the two parallel processing channels. The analog input signal is sampled through S/H circuits 12 and 14, and the held signals of the S/H circuits are combined, in alternate fashion, and delivered to the first flash A/D subconverter 10 and to the $V_{in}$ input of D/A converters 16 and 18 simultaneously. Because accurate resolution of the output code from flash A/D subconverter 10 is desired, D/A converter 16 may be of the capacitive type, which is capable of converting as many as ten bits without being unduly tolerance-dependent. A capacitive D/A converter is described in detail by R. E. Suarez et al., "All-MOS Charge Redistribution Analog-to-Digital Conversion Techniques—Part II", *IEEE J. Solid-State Circuits*, Vol. SC-10, pp. 379-385, December, 1975. The held analog signal produced by S/H circuits 12 and 14 is thus a stepwise approximation of the analog signal supplied to the S/H circuits.

The combined held analog input signal from S/H circuits 12 and 14 is converted by the first flash subconverter 10 to digital form made up of $n_1$ bits, and the resulting conversion code is sent to a calibrator 15 and to subtractive inputs S of capacitive D/A converters 16 and 18. The conversion code sent to calibrator 15 forms part of the output digital code generated by the system. Calibrator 15 is itself known in the art, as indicated by the aforementioned Lewis and Gray paper. The calibrator is employed due to the need for calibration (or digital correction) arising out of the nonlinearity that may be present in pipelined A/D converters with greater than 8- or 9-bit resolution. As indicated by Lewis and Gray, the correction logic of the calibrator improves the A/D converter linearity by delaying converter decisions on input signals near the first stage A/D subconverter decision levels until the residues from these signals have been sufficiently amplified to render insignificant any similar nonlinearities in subsequent A/D subconverters.

The $n_i$ bit conversion code supplied by A/D subconverter 10 is supplied, in alternate fashion, by switches $\phi_{11}$ to D/A converter 16 and by switches $\phi_{12}$ to D/A converter 18. The switches are clocked such that those with the second subscript being 1 are closed while those with the second subscript 2 are open, and conversely, those with the second subscript being 2 are closed while those with the second subscript being 1 are open. It will also be recognized that, since $n_1$ bits are being supplied in parallel to D/A converter 16 and also to D/A converter 18, switch $\phi_{11}$ represents $n_1$ switches operated in parallel and in unison, and switch $\phi_{12}$ similarly represents $n_1$ switches operated in parallel and in unison. In this fashion, D/A converters 16 and 18 alternately convert the conversion code from the first flash A/D subconverter 10 to an analog signal, designated a quantization signal. The corresponding quantization signal generated in D/A converters 16 and 18 is subtracted in the respective D/A converters from the held analog input voltage $V_{in}$, producing a residue signal, respectively, that is delivered to the following pipeline stage through unity gain buffers 20 and 22, respectively.

The second stage of the pipeline is made up of an n2-bit flash A/D subconverter 24 receiving output signals from unity-gain buffers 20 and 22, a D/A converter 26 coupled to the output of subconverter 24, and two comparator amplifiers 28 and 30, each having a gain of $2^{n_2-1}$ which, for $n_2=4$ as in the illustrated embodiment, is a gain of eight, with comparator amplifiers 28 and 30 operating alternately. Like the $n^1$ bits from flash A/D subconverter 10, the $n_2$ bits from flash A/D subconverter 24 are supplied not only to D/A converter 26 but also to calibrator 15 to become part of the output digital code of the system. Comparators 28 and 30, respectively, are connected to subtract the output signal of D/A converter 26 from the output signals of buffers 20 and 22, respectively. Those skilled in the art will appreciate that D/A converter 26, because it needs to convert fewer bits than D/A converters 16 and 18, may be of the resistive type. D/A converters of this type are typically capable of converting up to four or five bits, which is sufficient for the purposes for which it is employed herein, and are described, for example, in the aforementioned Lewis and Gray paper.

After converting the residue of the previous stage into $n_2$ bits of digital code, the second stage produces and delivers its residual voltage from comparators 28 and 30 to the last pipeline stage, made up of an $n_3$-bit flash A/D subconverter 32 which digitizes the residual voltage generated in the second pipeline stage and supplies the $n_3$ bits to calibrator 15 from whence the output digital code is produced.

The flash A/D subconverter of any pipeline stage may have offset and linearity errors large compared to ½ LSB (least significant bit) and may thus generate large residues that saturate the following stage. By doubling the conversion range for the following stage, this saturation effect can be avoided since the following stage will generate one extra bit which can be used to digitally correct the error of the previous stage. The calibrator 15 correction logic accomplishes this task.

Figure 3C:
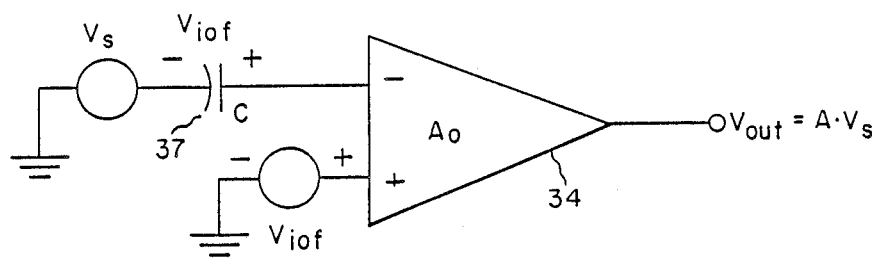
FIG. 3 is a block diagram of the parallel-autozero analog signal processing scheme used in the pipelined architecture of FIG. 1.
Figure 3:
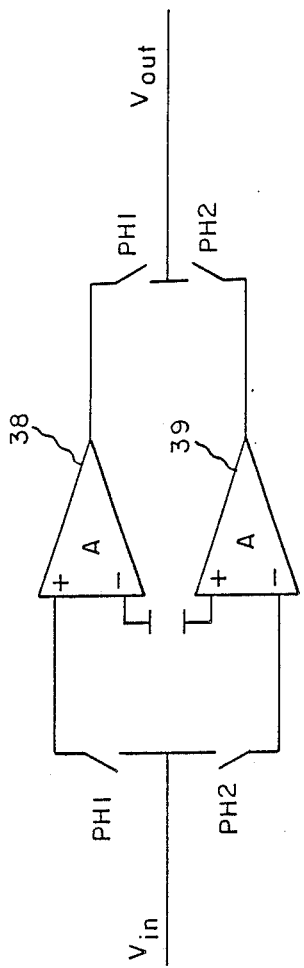
Figure 4:
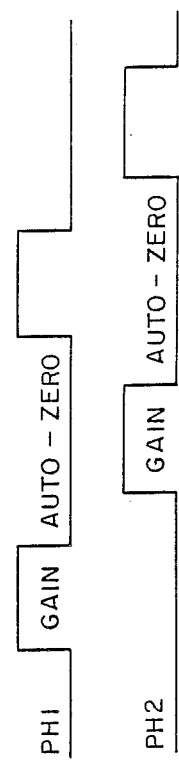
FIG. 4 is a timing diagram illustrating operation of the parallel-autozero analog signal processing scheme shown in FIG. 2.

A novel aspect of the pipelined A/D architecture shown in FIG. 1 is the utilization therein of a parallel-autozero analog signal processing scheme. This scheme, which is set forth in detail in Milkovic application Ser. No. 177,242, filed Apr. 4, 1988 and assigned to the instant assignee, is based on operating the two identical parallel analog circuits simultaneously but alternately, as shown in FIGS. 3 and 4, to alternately bring to zero the offset, noise and long-term drift in those circuits. The aforementioned Milkovic application is hereby specifically incorporated by reference. However, before describing the operation of the autozeroing feature according to the invention, reference is made to FIGS. 2A, 2B and 2C in order to better understand operation of the autozeroing function.

Figure 2A:
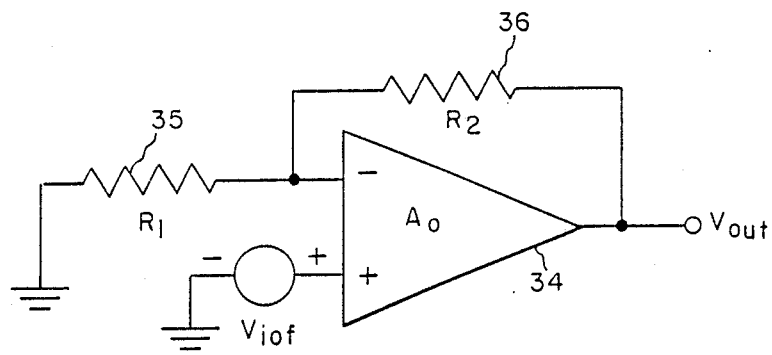
Figure 2B:
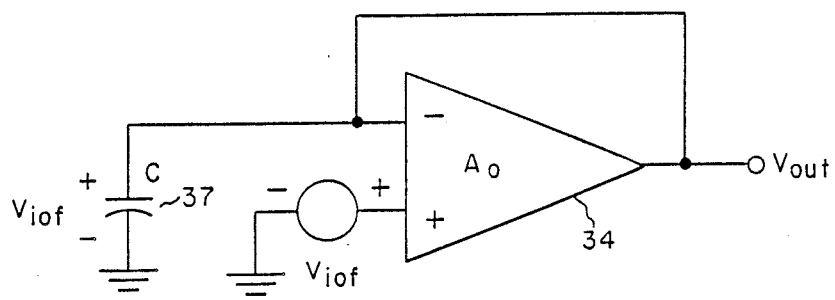

The basic concept of the autozeroing function is illustrated in FIGS. 2A and 2B. In FIG. 2A, an operational amplifier 34 of gain $A_o$ is shown with an input resistor 35 having a resistance value $R_1$ and a feedback resistor 36 having a resistance value $R_2$, both resistors being connected to the negative input of the amplifier. An offset voltage $V_{iof}$ is applied to the positive input of the amplifier. The output voltage $V_{out}$, assuming a high gain for amplifier 34, is given by the following expression:

$$V_{out} = V_{iof}\left(1 + \frac{R_2}{R_1}\right), \text{ for } A_o >> 1.$$

For the autozero function, $R_1 = \infty$ and $R_2 = 0$, so that the circuit shown in FIG. 2A may be represented by the circuit shown in FIG. 2B, wherein resistor 35 is replaced by a capacitor 37 and resistor 36 is replaced by a conductor. Thus the voltage across capacitor 37 shown in FIG. 2B is equal to $V_{iof}$, meaning that the capacitor has been charged to the offset voltage $V_{iof}$. The offset voltage applied to the positive terminal of the amplifier is therefore exactly canceled.

In the apparatus of FIG. 2C, $R_2 = \infty$ and capacitor 37 is in series with a signal source $V_s$. In this configuration the output voltage is given by the expression $$V_{out} = A_o V_s,$$

wherein $V_{iof}$ is exactly compensated by the precharge on capacitor 37.

In the present invention, alternate switching performs the autozeroing function sequentially in each path of the parallel architecture. Thus, if one channel is represented by amplifier 38 and the other, parallel channel is represented by amplifier 39, as shown in FIG. 3, the input and output switches are opened and closed according to the phase one (PH1) and phase two (PH2) timing shown in FIG. 4. Thus, at any moment, one of the two circuits is operating in the amplification mode while the other is in the autozeroing mode.

While it is known to apply the autozero concept to various analog circuits, including A/D converters, the present invention applies this concept to a pipelined A/D converter in a unique fashion. The alternate switching performs the autozeroing function sequentially, in each path of the parallel architecture, so that the signal flow is continuous, without any offset effects. The use of this parallel-autozero processing scheme results in an improved sampling speed (by a factor of two) with only a slight increase (approximately 10%) in chip area.

Another feature of this architecture is the use of unity-gain amplifiers, instead of the conventional $2^{n_1}$ gain amplifiers, in the first pipeline stage. As a result, (1) the first pipeline stage amplifier, which is the most crucial component in determining the A/D conversion speed for this architecture, advantageously requires a smaller gain-bandwidth product for a given sampling rate and (2) the analog signal range in the following pipeline stages is beneficially reduced by a factor of $2^{n_1}$, thereby enabling this architecture to operate at higher speed.

As an additional feature of the invention, use of capacitive D/A converters which operate on charge redistribution, instead of a resistive D/A converter array in the first pipeline stage, permits achievement of better accuracy, since for m-bit accuracy, a capacitive matching of less than m bits error is required.

The invention is applicable to a wide variety of video and digital signal processing applications that require high-speed and high-resolution analog-to-digital interface functions. Examples include radar and satellite signal processing and general instrumentation and high-quality video applications.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A pipelined analog-to-digital converter with parallel-autozero analog signal processing comprising:
   first and second sample-and-hold circuits for alternately sampling and holding an analog voltage signal to be converted to a digital code;
   a plurality of stages coupled in series in a pipeline, a first stage of the pipeline being connected to receive output signals from said first and second sample-and-hold circuits and producing a first part of said digital code and a residue voltage, each stage of the pipeline comprising a flash analog-to-digital subconverter, respectively, the subconverter of each of an intermediate and a final stage converting a residue voltage from a preceding stage to a succeeding part of said digital code, each of the first and intermediate stages including parallel circuit paths;
   first switching means coupled to said first and second sample-and-hold circuits and to said parallel circuit path in said first stage for alternately connecting one of said first and second sample-and-hold circuits, respectively, and said parallel circuit path of said first stage in a signal path and for autozeroing the sample-and-hold circuit and circuit path not connected in said signal path; and
   second switching means coupled to said parallel circuit path in said second stage for alternately connecting said parallel circuit path of said second stage in said signal path;
   whereby signal flow at the output of said pipelined analog-to-digital converter is continuous without degradation due to offset voltages.

2. The pipelined analog-to-digital converter of claim 1 wherein said first stage additionally comprises a unity-gain amplifier in each of said parallel circuit paths, respectively, supplying a residual voltage from said first stage to a second stage so as to require a minimal gain band-width product and allow the converter to operate at high speed.

3. The pipelined analog-to-digital converter of claim 2 wherein said first stage additionally comprises a pair of digital-to-analog converters, the sampled and held voltages of said first and second sample-and-hold circuits being delivered to said flash analog-to-digital subconverter of said first stage and to each of said digital-to-analog converters simultaneously, said first part of said digital code being supplied by the flash analog-to-digital subconverter of said first stage to each of said digital-to-analog converters, the outputs of said digital-to-analog converters being alternately coupled by a respective one of said unity-gain amplifiers to the flash analog-to-digital subconverter of the second stage of the pipeline so as to supply thereto, in alternating fashion, the residual voltage of the first stage.

4. The pipelined analog-to-digital converter of claim 3 wherein the intermediate stage of the pipeline additionally comprises digital-to-analog converter means and a pair of amplifiers having identical gains greater than one coupled to the flash analog-to-digital subconverter of the final stage, a second part of said digital code produced by the flash analog-to-digital subconverter of said intermediate stage being supplied to said digital-to-analog converter means, and means coupling an output of said digital-to-analog converter means alternately to one or the other of said pair of amplifiers.

5. The pipelined analog-to-digital converter of claim 1 wherein said preceding stage comprises an immediately preceding stage.

6. The pipelined analog-to-digital converter of claim 3 wherein each of said digital-to-analog converters comprises a capacitive digital-to-analog converter.

7. The pipelined analog-to-digital converter of claim 4 wherein said flash analog-to-digital subconverter means produces an output code of $n_2$ bits and the gain of each one of said pair of amplifiers is $2^{n_2-1}$.

8. The pipelined analog-to-digital converter of claim 4 wherein said digital-to-analog converter means comprises a resistive digital-to-analog converter.

* * * * *